US012216064B2

United States Patent
Fujimoto et al.

(10) Patent No.: US 12,216,064 B2
(45) Date of Patent: Feb. 4, 2025

(54) INSPECTION DEVICE

(71) Applicant: FUJI CORPORATION, Chiryu (JP)

(72) Inventors: Tomoya Fujimoto, Nagoya (JP);
Takahiro Kobayashi, Chiryu (JP);
Yuki Inaura, Chiryu (JP)

(73) Assignee: FUJI CORPORATION, Chiryu (JP)

( * ) Notice: Subject to any disclaimer, the term of this patent is extended or adjusted under 35 U.S.C. 154(b) by 373 days.

(21) Appl. No.: 17/629,757

(22) PCT Filed: Jul. 26, 2019

(86) PCT No.: PCT/JP2019/029471
§ 371 (c)(1),
(2) Date: Jan. 24, 2022

(87) PCT Pub. No.: WO2021/019610
PCT Pub. Date: Feb. 4, 2021

(65) Prior Publication Data
US 2022/0252524 A1    Aug. 11, 2022

(51) Int. Cl.
*G01N 21/95* (2006.01)
*G01N 21/88* (2006.01)
*H05K 13/08* (2006.01)

(52) U.S. Cl.
CPC ............. *G01N 21/95* (2013.01); *H05K 13/08* (2013.01); *G01N 2021/8845* (2013.01); *G01N 2021/8887* (2013.01)

(58) Field of Classification Search
CPC ........... G01N 21/95; G01N 2021/8845; G01N 2021/8887; H05K 13/08
See application file for complete search history.

(56) References Cited

U.S. PATENT DOCUMENTS 5,774,572 A * 6/1998 Caspi .................. G06T 7/12
382/141
5,930,009 A * 7/1999 Sato ...................... H04N 1/622
358/518

(Continued)

FOREIGN PATENT DOCUMENTS

JP           1140983 A  *  2/1992
JP      H1140983 A  * 12/1999

(Continued)

OTHER PUBLICATIONS

International Search Report mailed on Oct. 21, 2019 in PCT/JP2019/029471 filed on Jul. 26, 2019, 2 pages.

*Primary Examiner* — Uzma Alam
*Assistant Examiner* — Jonathon Cook
(74) *Attorney, Agent, or Firm* — Oblon, McClelland, Maier & Neustadt, L.L.P.

(57) ABSTRACT

An inspection device is such that the inspection device executes a mounting inspection of a component using an inspection image of a board on which the component is mounted and includes an imaging device and an image processing device. The imaging device obtains three monochromatic images of the board in R, G, B. The image processing device sets a board color using brightness values of the three monochromatic images obtained by the imaging device, calculates complementary colors of the board color so set, determines on a color component having a largest brightness value in individual color components of the complementary colors so calculated, and sets the monochromatic image having the color component so determined in the obtained three monochromatic images as the inspection image.

3 Claims, 9 Drawing Sheets

(56) References Cited

U.S. PATENT DOCUMENTS

| | | | | |
|---|---|---|---|---|
| 2006/0181700 A1* | 8/2006 | Andrews | ............ | G01N 21/4738 |
| | | | | 356/237.2 |
| 2009/0284754 A1* | 11/2009 | Haddock | ................ | G01B 11/24 |
| | | | | 356/601 |
| 2010/0229377 A1* | 9/2010 | Jindo | ................ | H05K 13/0812 |
| | | | | 29/709 |
| 2017/0289416 A1 | 10/2017 | Umemura et al. | | |
| 2019/0271593 A1* | 9/2019 | Oguchi | ................ | G01J 3/2823 |

FOREIGN PATENT DOCUMENTS

| JP | 2016-130663 A | 7/2016 |
|---|---|---|
| JP | 2017-181188 A | 10/2017 |
| JP | 2018-138871 A | 9/2018 |

* cited by examiner

INSPECTION DEVICE

TECHNICAL FIELD

The present description discloses an inspection device.

BACKGROUND ART

Conventionally, there has been known an image processing device for processing a captured image of a circuit board. For example, Patent Literature 1 discloses a board mark recognition device for illuminating a predetermined imaging range including a marking position of a board mark set in a predetermined position on a circuit board and detecting a brightness difference between a board surface and the marking position of the board mark in a captured image of the imaging range to thereby recognize whether the board mark is marked in the marking position. This board mark recognition device includes a camera, an image processing section for image processing a captured image inputted thereinto from the camera, multiple complementary color light sources, and an illumination control section for controlling respective lighting-up states of the individual complementary color light sources. The image processing section receives captured images which are captured by the camera by lighting individually the complementary color light sources and inputted thereinto from the camera and calculates brightness differences between board marks and board surfaces in the captured images so inputted. Then, the image processing section selects the complementary color light source by which a maximum brightness difference between the board mark and the board surface in the captured image is obtained in the multiple complementary color light sources and lights the same complementary color light source.

PATENT LITERATURE

Patent Literature 1: JP-A-11-40983

BRIEF SUMMARY

Technical Problem

Although Patent Literature 1 described above describes the configuration in which the imaging range including the marking position of the board mark is captured by the camera while being illuminated by the complementary color light source to thereby detect the brightness difference between the board surface and the board mark in the captured image, no method is mentioned at all for executing a mounting inspection of a component with good precision using an inspection image of a board on which the component is mounted.

A main object of the present disclosure is to execute a mounting inspection of a component accurately using an inspection image of a board on which the component is mounted.

Solution to Problem

The present disclosure has taken the following means to achieve the main object thereof described above.

According to a first gist of the present disclosure, there is provided a first inspection device constituting an inspection device for executing a mounting inspection of a component using an inspection image of a board on which the component is mounted, including:

an imaging device configured to obtain three monochromatic images of the board in R, B, G; and an image processing device configured to set a board color using brightness values of the three monochromatic images so obtained, calculate complementary colors of the board color so set, determine on a color component having a largest brightness value in individual color components of the complementary colors so calculated, and set the monochromatic image having the color component so determined in the obtained three monochromatic images as the inspection image.

The first inspection device of the present disclosure obtains the three monochromatic images of the board in R, G, B and sets the board color using the respective brightness values of the three monochromatic images so obtained. Subsequently, the first inspection device calculates the complementary colors of the set board color and determines on the color component having the largest brightness value in the color components of the complementary colors so calculated. Then, the first inspection device sets the monochromatic image having the determined color component in the three monochromatic images as the inspection image. As a result, since the image captured using the optimum light source while recognizing the board color can be used for the mounting inspection of the component, the inspection precision can be improved further.

According to a second gist of the present disclosure, there is provided a second inspection device constituting an inspection device for executing a mounting inspection of a component using an inspection image of a board on which the component is mounted, including:

an imaging device configured to obtain three monochromatic images of the board in R, B, G; and an image processing device configured to calculate a contrast within a predetermined area including at least an electrode section that the component has and an electrode circumferential portion whose reflectance differs from a reflectance of the electrode section individually for the obtained three monochromatic images and set the monochromatic image of a color component having a largest value in the contrast in the three monochromatic images as the inspection image.

The second inspection device of the present disclosure obtains the three monochromatic images of the board in R, G, B and calculates a contrast within the area including at least the electrode section that the component has and the electrode circumferential portion whose reflectance differs from the reflectance of the electrode section individually for the obtained three monochromatic images. Then, the second inspection device sets the monochromatic image of the color component having the largest value in the contrast in the three monochromatic images as the inspection image. As a result, since the image captured using the optimum light source for distinguishing between the electrode section and the electrode circumferential portion can be used for the mounting inspection of the component as the inspection image, the inspection precision can be improved further.

DESCRIPTION OF EMBODIMENTS

Next, an embodiment of the present disclosure will be described.

Figure 1:
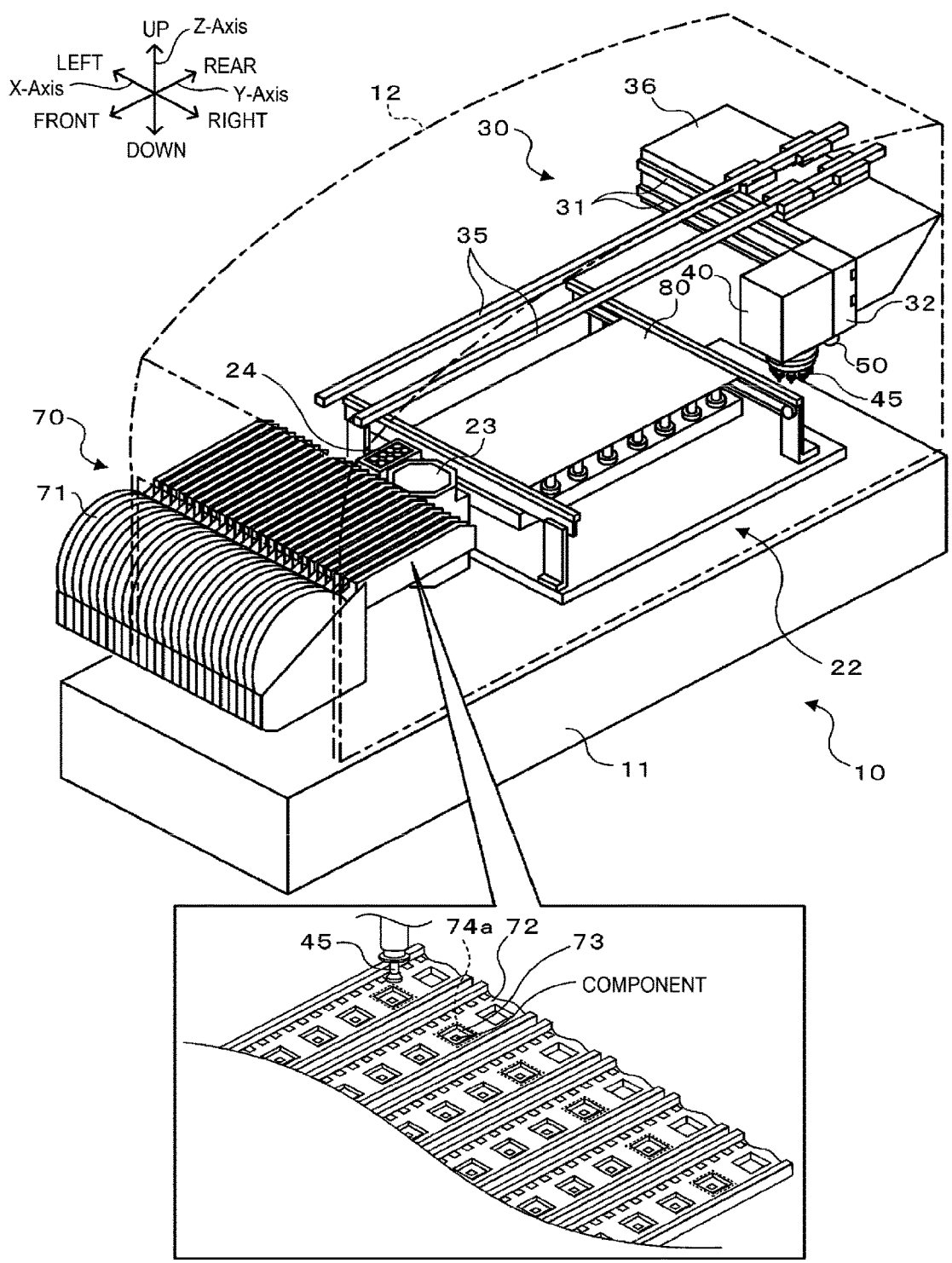
FIG. 1 is a configuration diagram showing schematically the configuration of component mounter 10 of a first embodiment.
Figure 2:
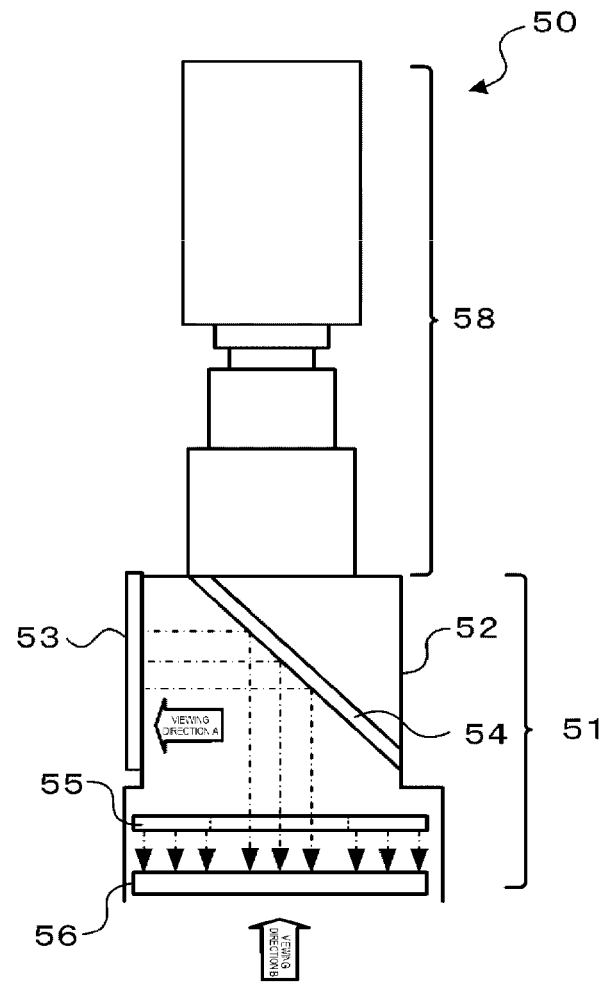
FIG. 2 is a configuration diagram showing schematically the configuration of mark camera 50.
Figure 3:
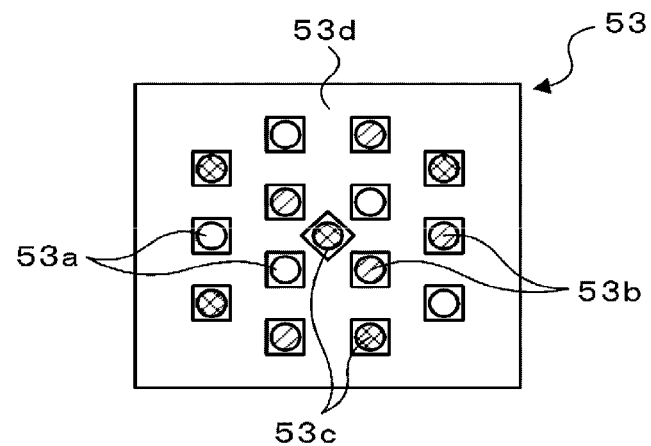
FIG. 3 is a view of epi-illuminating light source 53 as viewed in a direction indicated by an arrow A.
Figure 4:
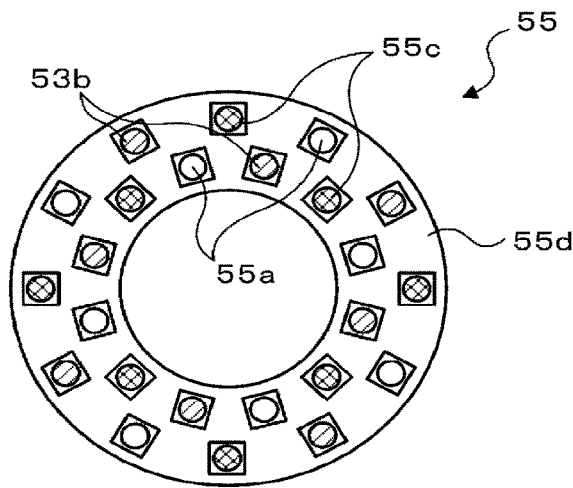
FIG. 4 is a view of side light source 55 as viewed in a direction indicated by an arrow B.
Figure 5:
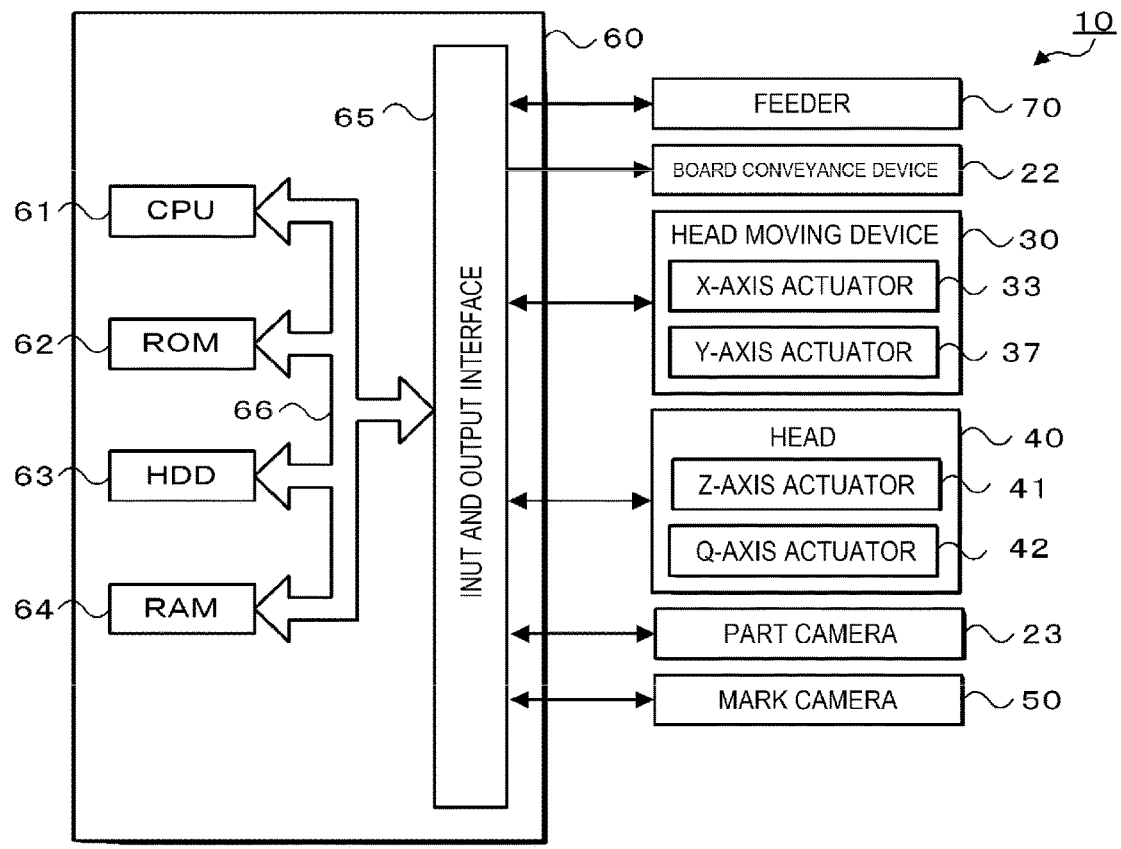
FIG. 5 is a block diagram showing a configuration regarding the control of component mounter 10.

FIG. 1 is a configuration view showing schematically the configuration of component mounter 10 of the present embodiment. FIG. 2 is a configuration diagram showing schematically the configuration of mark camera 50. FIG. 3 is a view of epi-illuminating light source 53 as viewed in a direction indicated by an arrow A. FIG. 4 is a view of side light source 55 as viewed in a direction indicated by an arrow B. FIG. 5 is a block diagram showing a configuration regarding the control of component mounter 10. In FIG. 1, a left-right direction denotes an X-axis direction, a front (a near side)-rear (a far side) direction denotes a Y-axis direction, and an up-down direction denotes a Z-axis direction.

As shown in FIG. 1, component mounter 10 includes board conveyance device 22 for conveying board 80, head 40 for picking up a component with suction nozzle 45 and mounting the component on board 80, head moving device 30 for moving head 40 in the X-axis direction and the Y-axis direction, mark camera 50 for imaging board 80, and feeder 70 for supplying components to head 40. These are accommodated in housing 12 placed on base plate 11. In addition to these constituent elements, component mounter 10 also includes part camera 23 for imaging a component picked up by and held to head 40, nozzle station 24 for accommodating suction nozzles 45 for exchange, and the like. Multiple component mounters 10 are arranged side by side in a board conveyance direction (the X-axis direction) to form a production line.

Board conveyance device 22 is placed on base plate 11. Board conveyance device 22 includes a pair of conveyor rails arranged in such a manner as to be spaced part from each other in the Y-axis direction and conveys board 80 from the left to the right in FIG. 1 (the board conveyance direction) by driving the pair of conveyor rails.

As shown in FIG. 1, head moving device 30 includes pair of X-axis guide rails 31, X-axis slider 32, X-axis actuator 33 (refer to FIG. 5), pair of Y-axis guide rails 35, Y-axis slider 36, and Y-axis actuator 37 (refer to FIG. 5). Pair of Y-axis guide rails 35 are disposed at an upper stage in housing 12 in such a manner as to extend parallel to each other in the Y-axis direction. Y-axis slider 36 extends to span pair of Y-axis guide rails 35 and moves in the Y-axis direction along Y-axis guide rails 35 by being driven by Y-axis actuator 37. Pair of X-axis guide rails 31 are placed on a front surface of Y-axis slider 36 in such a manner as to extend parallel to each other in the X-axis direction. X-axis slider 32 extends to span pair of X-axis guide rails 31 and moves in the X-axis direction along X-axis guide rails 31 by being driven by X-axis actuator 33. Head 40 is attached to X-axis slider 32, and head moving device 30 moves head 40 in the X-axis direction and the Y-axis direction by moving X-axis slider 32 and Y-axis slider 36 accordingly.

Head 40 includes Z-axis actuator 41 (refer to FIG. 3) for moving suction nozzle 45 in the Z-axis (the up-down) direction and θ-axis actuator 42 (refer to FIG. 3) for rotating suction nozzle 45 around a Z-axis. Head 40 can pick up a component by suction by causing a negative pressure source to communicate with a suction port of suction nozzle 45 so as to apply a negative pressure to the suction port. In addition, head 40 can release the component held to the suction port thereof by causing a positive pressure source to communicate with the suction port of suction nozzle 45 so as to apply a positive pressure to the suction port thereof. Head 40 may be a head including single suction nozzle 45 or may be a rotary head including multiple suction nozzles 45 which are arranged at equal intervals along an outer circumference of a cylindrical head main body. As a member for holding a component, a mechanical chuck or an electromagnet may be used in place of suction nozzle 45.

Part camera 23 is placed on base plate 11. Part camera 23 images a component picked up by and held to suction nozzle 45 from below when the component passes over part camera 23 to generate a captured image of the component and outputs the captured image so generated to control device 60.

Mark camera 50 is attached to X-axis slider 32 and is caused to move in the X-axis direction and the Y-axis direction together with head 40 by head moving device 30. Mark camera 50 generates a captured image of an imaging target object by imaging the imaging target object from above and outputs the captured image of the imaging target object so generated to control device 60. Examples of imaging target objects for mark camera 50 include a component held onto tape 72 that is fed out by feeder 70, a mark affixed to board 80, a component that has been mounted on board 80, solder S with which a circuit wiring (a copper foil) is printed on board 80, and the like.

As shown in FIG. 2, mark camera 50 includes lighting device 51 and camera main body 58. Lighting device 51 includes housing 52, epi-illuminating light source 53, half mirror 54, and side light source 55. Housing 52 is a cylindrical member which is opened in a lower surface and is attached to a lower portion of camera main body 58. epi-illuminating light source 53 is provided on an inner side surface of housing 52. As shown in FIG. 3, epi-illuminating light source 53 is such that the same or substantially the same number of red LEDs 53a for emitting monochromatic light of red (R), green LEDs 53b for emitting monochromatic light of green (G), and blue LEDs 53c for emitting monochromatic light of blue (B) are disposed on a quadrangular support plate 53d. LEDs 53a to 53c are each such that a hemispherical lens is attached to a quadrangular base on which a light emitting element is disposed at the center thereof so as to cover the light emitting element. Half mirror 54 is provided inside housing 52 in such a manner as to become oblique therein. Half mirror 54 reflects horizontal lights emitted from individual LEDs 53a, 53b, 53c of epi-illuminating light source 53 downwards. Half mirror 54 transmits therethrough light from below towards camera main body 58. Side light source 55 is provided in the vicinity of a lower opening in housing 52 in such a manner as to become horizontal. As shown in FIG. 4, side light source 55 is such that the same number or substantially the same number of red LEDs 55*a*, green LEDs 55*c*, and blue LEDs 55*c* are disposed on ring-shaped support plate 55 and irradiates light downwards. LEDs 55*a* to 55*c* are each such that a hemispherical lens is attached to a quadrangular base on which a light emitting element is disposed at the center thereof in such a manner as to cover the light emitting element. Diffuse plate 56 is provided below side light source 55 in housing 52. Lights emitted from epi-illuminating light source 53 and side light source 55 are finally irradiated onto a target object after the lights are diffused at this diffuse plate 56. camera main body 58 is a monochromatic camera for generating a monochromatic captured image (a monochromatic image) based on light which camera main body 58 receives. This camera main body 58 includes an optical system such as a lens, not shown, and a monochromatic imaging element (for example, a monochromatic CCD). When lights emitted from epi-illuminating light source 53 and side light source 55 and reflected on the target object are transmitted through half mirror 54 and then reach camera main body 58, camera main body 58 receives these lights to generate a monochromatic image.

Although the respective wavelength regions of the colors of R, G, B are not particularly limited, the wavelength regions may range, for example, from 590 to 780 nm for R, from 490-570 nm for G, and from 400-490 nm for B, respectively.

Feeder 70 includes reels 71 around each of which tape 72 is wound and a tape feeding mechanism, not shown, for unwinding tape 72 from corresponding reel 71 so as to feed that tape 72 to component supply position 74*a*. Multiple accommodation recessed sections 73 are provided at equal intervals in a front surface of tape 72 along a longitudinal direction of tape 72. Components are accommodated individually in accommodation recessed sections 73. These components are protected by a film which covers the front surface of tape 72. When the film is peeled off in component supply position 74*a*, tape 72 is in such a state that a component is exposed. The component fed out to component supply position 74*a* is picked up by suction nozzle 45 through suction.

As shown in FIG. 5, control device 60 is configured as a microprocessor which is mainly made up of CPU 61 and includes, in addition to CPU 61, ROM 62, HDD 63, RAM 64, and input and output interface 65. These elements are electrically connected to one another via bus 66. An image signal from mark camera 50, an image signal from part camera 23, and the like are inputted into control device 60 via input and output interface 65. On the other hand, various signals are outputted from control device 60 to the constituent elements via input and output interface 65; for example, a control signal is outputted to board conveyance device 22, a drive signal is outputted to X-axis actuator 33, a drive signal is outputted to Y-axis actuator 37, a drive signal is outputted to Z-axis actuator 41, a drive signal is outputted to θ-axis actuator 42, a control signal is outputted to part camera 23, a control signal is outputted to mark camera 50, and a control signal is outputted to feeder 70.

Next, an operation of component mounter 10 of the present embodiment that is configured as described heretofore will be described. First of all, a component mounting process will be described which component mounter 10 executes on board 80 in accordance with a production schedule received from a management device, not shown. Firstly, CPU 61 of control device 60 of component mounter 10 causes head moving device 30 to move suction nozzle 45 above component supply position 74*a* of feeder 70 for supplying a component constituting a mounting target object. Subsequently, CPU 61 executes a pickup operation in which head 40 causes suction nozzle 45 to pick up a component through suction. Specifically speaking, a pickup operation is executed as follows; Z-axis actuator 41 is caused to be driven to lower suction nozzle 45 down until a distal end (a suction port) of suction nozzle 45 comes into abutment with a component, and a negative pressure is applied to the suction port of suction nozzle 45. Then, CPU 61 causes head moving device 30 to move the component picked up by suction nozzle 45 above part camera 23, thereafter causes part camera 23 to image the component, and recognizes an orientation of the component based on a captured image so obtained. Next, CPU 61 calculates an amount of pickup deviation based on the recognized orientation of the component, corrects a mounting position based on the calculated amount of pickup deviation, and causes head moving device 30 to move the component picked up by suction nozzle 45 above the mounting position on board 80. Then, CPU 61 executes a mounting operation in which head 40 is caused to mount the component in the mounting position. Specifically speaking, the mounting operation is executed as follows; Z-axis actuator 41 is caused to be driven so as to lower suction nozzle 45 down until the component picked up by suction nozzle 45 comes into abutment with board 80, and a positive pressure is applied to the suction port of suction nozzle 45. CPU 61 repeatedly executes this component mounting process to thereby mount components of predetermined number and types on board 80. In the present embodiment, a production line is configured by aligning multiple component mounters 10 side by side in the board conveyance direction. As a result, it is designed that when board 80 is conveyed from an upstreammost component mounter 10 to a downstream-most component mounter 10 along the production line, all predetermined components are mounted on board 80.

Figure 6:
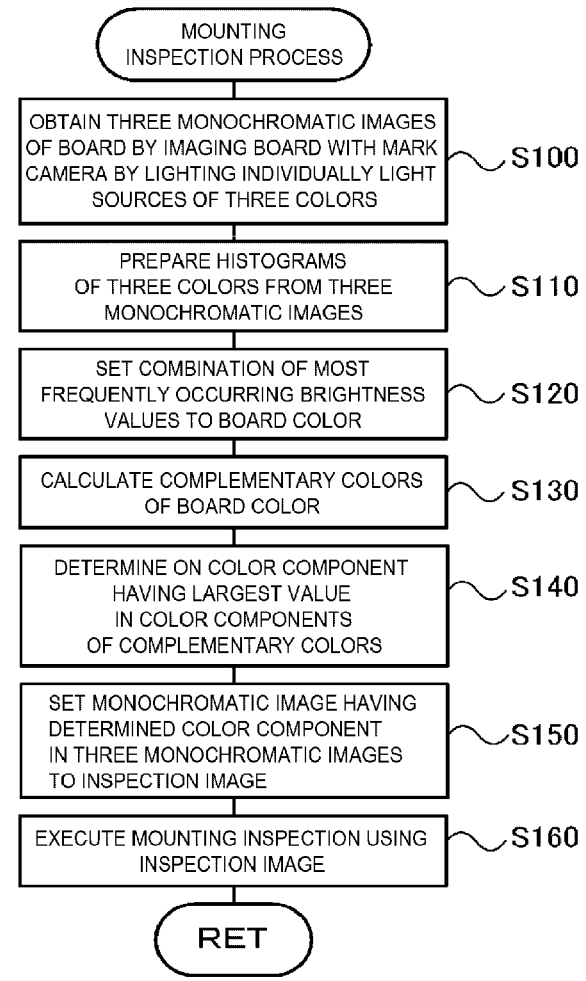
FIG. 6 is a flowchart showing an example of a mounting inspection process.
Figure 7:
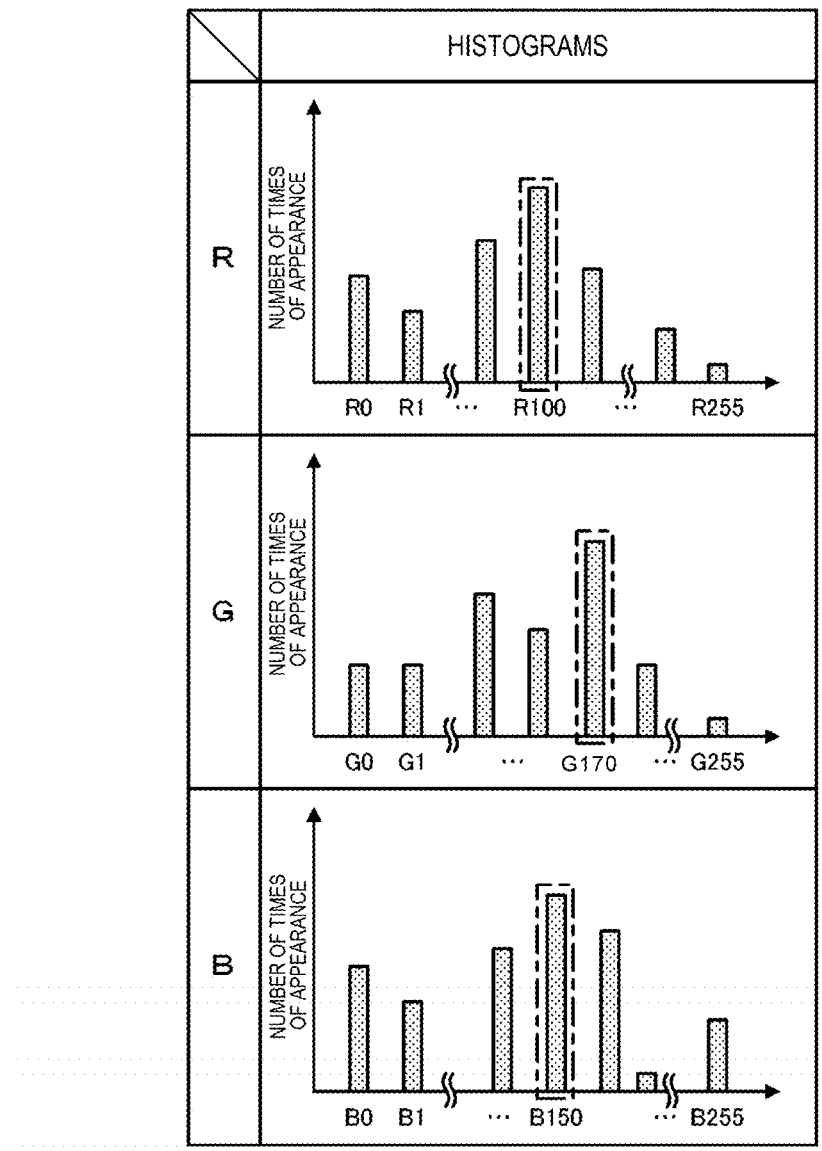
FIG. 7 is an explanatory diagram showing examples of histograms of individual color components.

Next, a mounting inspection of components will be described which is executed after component mounter 10 has completed the component mounting process. Here, mark camera 50 and control device 60 correspond to the inspection device of the present disclosure. FIG. 6 is a flowchart showing an example of a mounting inspection process executed by CPU 61 of control device 60. First of all, CPU 61 lights individually the LEDs of the light source of epi-illuminating light source 53 and side light source 55 for use, causes mark camera 50 to image board 80 which is now being illuminated with lights emitted from the LEDS so lit, and obtains three monochromatic images of board 80 in R, G, B (step S100). Subsequently, CPU 61 prepares histograms for individual color components from the three monochromatic images (step S110). FIG. 7 is an explanatory diagram showing examples of histograms of the individual color components. As shown therein, the histograms of the individual color components are those indicating the numbers of occurrence or appearance of brightness values 0 to 255 when representing brightness values of R, G, B by 256 gradations. Then, CPU 61 sets a combination of most frequently occurring brightness values (brightness values of a largest number of times of appearance) in the individual histograms as a board color (R,G, B) (step S120). In the example of FIG. 7, R=100, G=170, B=150 are set to the board color (R, G, B).

When CPU 61 has set the board color (R,G,B), CPU 61 calculates complementary colors (R', G', B') of the board color (R, G, B) (step S130). Here, the complementary colors (R', G', B') are expressed by the following expressions (1) to (3) when assuming that a largest number of times of appearance is referred to as Max, while a smallest number of times of appearance is referred to as Min in the individual color components of the board color (R, G, B). For example, when the board color (R, G, B) is a combination of R=100, G=170, B=150, since Max=170 and Min=100, complementary colors (R', G', B') are represented by a combination of R'=170, G'=100, B'=120.

$$R'=(Max+Min)-R \quad (1)$$

$$G'=(Max+Min)-G \quad (2)$$

$$B'=(Max+Min)-B \quad (3)$$

When CPU 61 has calculated the complementary colors (R', G', B'), CPU 61 determines on a color component having a largest value in color components of the complementary colors (R', G', B') (step S140) and sets the monochromatic image having the color component so determined in step S100 to an inspection image (step S150). For example, when the complementary colors (R', G', B') are such that R'=170, G'=100, and B'=120, since a color component having a largest value is red (R), in the three monochromatic images, the monochromatic image captured using an illumination light from the red LEDs is set as an inspection image. As a result, the monochromatic image captured using the illumination light of the color closest to the complementary colors of the board color is set to the inspection image. Having set the inspection image in this manner, CPU 61 executes the mounting inspection using the inspection image so set (step S160) and ends the present processing. The mounting inspection may be executed, for example, so that an image processing is executed for recognizing a component in the inspection image, and when the component is recognized successfully, the component is determined to have been mounted properly, while when the recognition of the component fails, the component is determined not to have been mounted properly. In addition, the mounting inspection may be executed so that an amount of mounting deviation (an amount of positional deviation or an amount of rotational deviation) of a component relative to board 80 is calculated from the result of the recognition of the component, and when the mounting deviation so calculated falls within a permissible range, the component is determined to have been mounted properly, while when the mounting deviation calculated exceeds the permissible range, the component is determined not to have been mounted properly.

As described heretofore, CPU 61 lights individually and separately the R, G, B LEDs of lighting device 51 to obtain three monochromatic images and sets the monochromatic image in the three monochromatic images which is obtained or captured using the monochromatic light closest to the complementary colors of the board color to the inspection image. Then, CPU 61 executes the image processing for recognizing a component mounted on board 80 in the inspection image so set to thereby execute the mounting inspection of the component. In the monochromatic image captured by lighting the LEDs whose color is in a complementary color relationship with the board color, the brightness of a captured portion of board 80 becomes lower than those of captured portions of boards 80 in the monochromatic images captured by lighting the other LEDs than the LEDs whose color is in the complementary color relationship with the board color, and therefore, a contract between board 80 and a component mounted on board 80 increases. As a result, the component can easily be distinguished from its background (the board), whereby the recognition precision of the component can be enhanced.

Here, the correspondence between the principal elements of the embodiment that has been described heretofore and the principal elements of the present disclosure described as means for solving the problems inherent in the related art will be described. That is, mark camera 50 corresponds to the imaging device, and control device 60 corresponds to the image processing device.

Needless to say, the present disclosure is not limited to the embodiment that has been described heretofore in any way, and hence, the present disclosure can be carried out in various manners without departing from the technical scope of the disclosure of the present disclosure.

Figure 8:
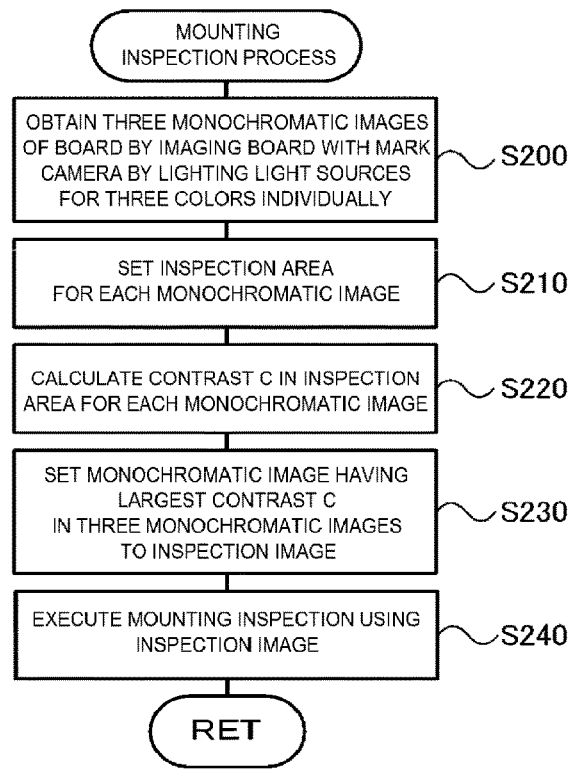
FIG. 8 is a flowchart showing an example of a mounting inspection process according to a second embodiment.
Figure 9:
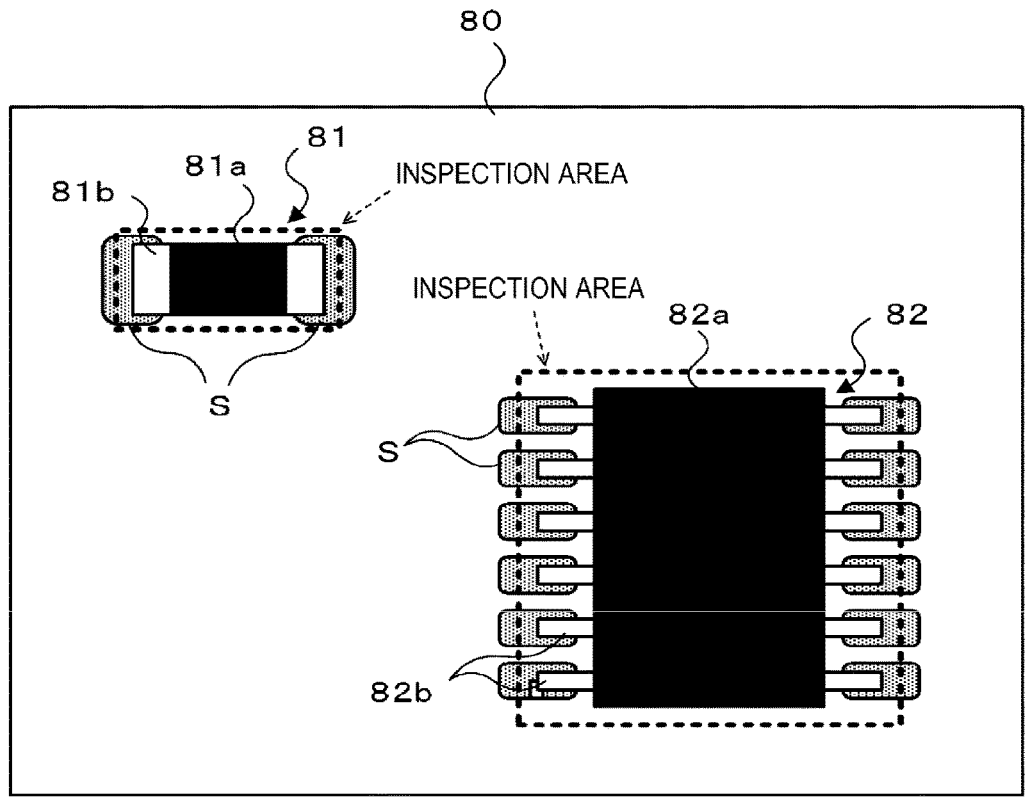
FIG. 9 is an explanatory diagram showing a first example of an inspection area in a captured image.
Figure 10:
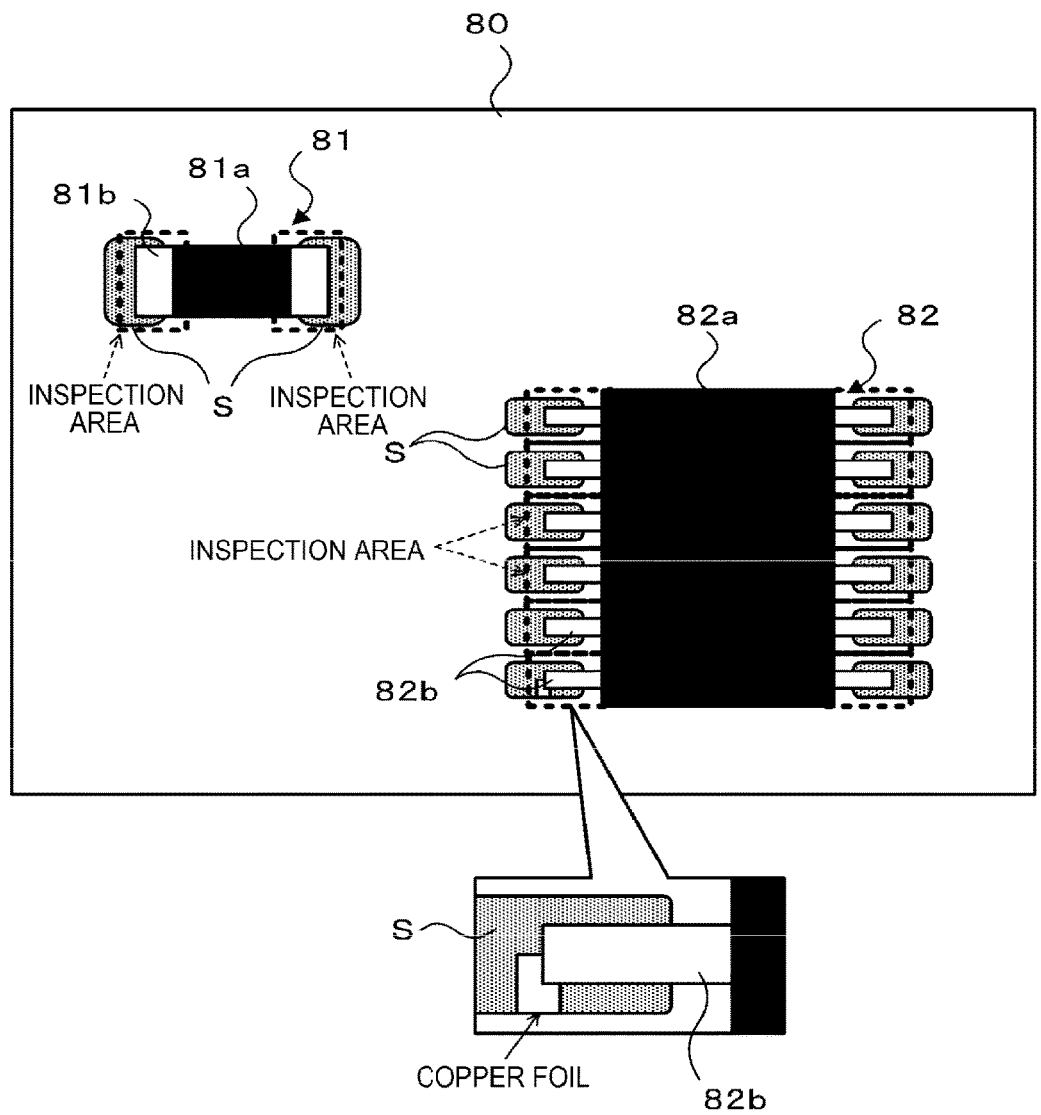
FIG. 10 is an explanatory diagram showing a second example of an inspection area in a captured image.

For example, in the embodiment described above, CPU 61 executes the mounting inspection process illustrated in FIG. 6, however CPU 61 may execute a mounting inspection process illustrated in FIG. 8 instead. In the mounting inspection process shown in FIG. 8, as with step S100 in the component inspection process of the present embodiment, CPU 61 first lights individually and separately the LEDs of the three colors to obtain three corresponding monochromatic images (step S200). Next, CPU 61 sets the same inspection area in each of the three monochromatic images (step S210). The processing in step S210 can be executed, for example, so that CPU 61 obtains a type and dimensions of an inspection target component which constitutes an inspection target in components mounted on board 80 and sets an area resulting from adding a predetermined margin to an external shape of a component which is specified by the type and dimensions so obtained to an inspection area. For example, as shown in FIG. 9, in the case that the inspection target component is rectangular chip component 81 in which electrode sections 81*b* are provided on both sides of body section 81*a*, the inspection area constitutes a rectangular range in which a margin is added to an external shape of chip component 81. In addition, for example, as shown in FIG. 9, in the case that the inspection target component is lead component 82 (for example, SOP or the like) in which multiple electrode sections 82*b* (lead pins) are provided on each side of body component 82*a,* the inspection area constitutes a rectangular range in which a margin is added to a rectangular external shape which encompasses electrode sections 82*b* of lead component 82. The predetermined margin may be a predetermined value or may be a value obtained by multiplying the size of a component by a predetermined coefficient (for example, 1.1 or 1.2). The processing in step S210 can also be executed, for example, so that an area is obtained from an operator or the like which encompasses electrode sections possessed by an inspection target component, constituting an inspection target, in components mounted on board 80 and circumferential portions of the electrode sections, and the area so obtained is set to an inspection area. For example, as shown in FIG. 10, in the case that an inspection target component is chip component 81, an inspection area is made up of two rectangular ranges which each encompass a different electrode section 81*b* of two electrode sections 81*b* of that chip component 81 and solder S or a copper foil which constitutes a circumferential portion of the different electrode section 81b. In addition, for example, as shown in FIG. 10, in the case that an inspection target component is lead component 82, an inspection area is made up of multiple rectangular ranges which each encompass a different electrode section 82b in multiple electrode sections 82b possessed by that lead component 82 and solder S or a copper foil which constitutes a circumferential portion of the different electrode section 82b.

Figure 11:
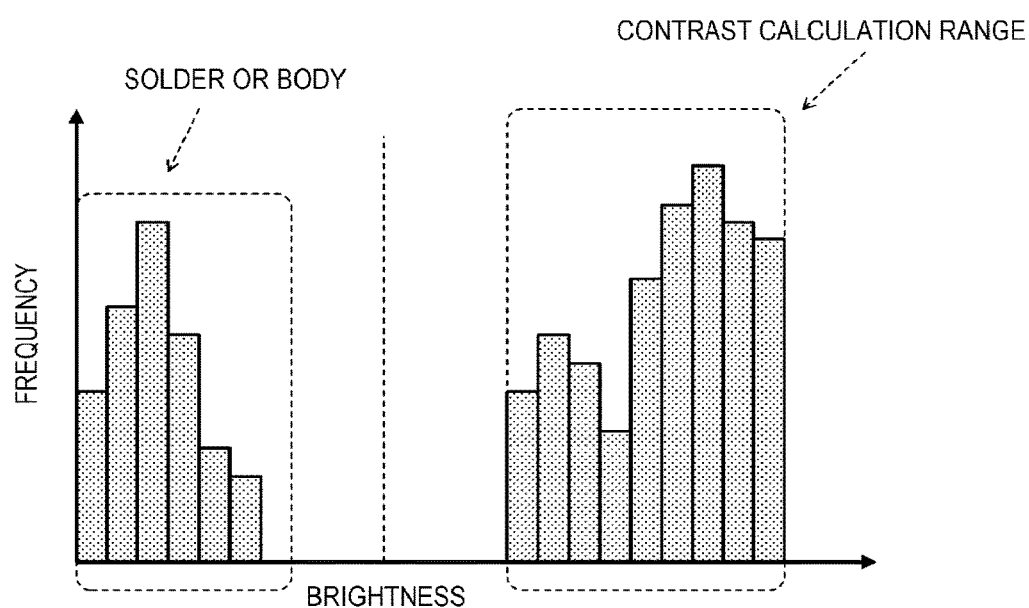
FIG. 11 is an explanatory diagram showing a contrast calculation range.

When CPU 61 sets inspection areas for three monochromatic images, CPU 61 calculates contrasts for the inspection areas (electrode sections and circumferential areas thereof) of the three monochromatic images (step S220). For example, assuming that a maximum value of a brightness value in an image in the inspection area is referred to as Lmax, and a minimum value is referred to as Lmin, contrast C can be calculated by the following expression (4) or (5). As shown in FIG. 11, since solder S or a body portion of a component has a low reflectance, a brightness value of a solder S portion or the body portion of the component in each of captured three monochromatic images of a board on which components are mounted tends to concentrate at low values. On the other hand, since an electrode of the component is silver in color and has a high reflectance, a brightness value of an electrode section tends to concentrate at high values. Since the inspection area is set so as to surround, as described above, the electrode section and the electrode circumferential portion, which constitutes a background for the electrode section, of the component, it can be said that the monochromatic image in which contrast C is high in the inspection area constitutes an image in which the electrode section is easily distinguished from the background (the electrode circumferential portion), while the monochromatic image in which contrast C is low in the inspection area constitutes an image in which the electrode section is distinguished from the background (the electrode circumferential portion) with difficulty.

$$C=(Lmax-Lmin)/(Lmax+Lmin) \quad (4)$$

$$C=Lmax/Lmin \quad (5)$$

Then, CPU 61 sets, in the three monochromatic images, the monochromatic image exhibiting largest contrast C to an inspection image (step S230), executes the mounting inspection using the inspection image so set (step S240), and ends the present process.

Figure 12:
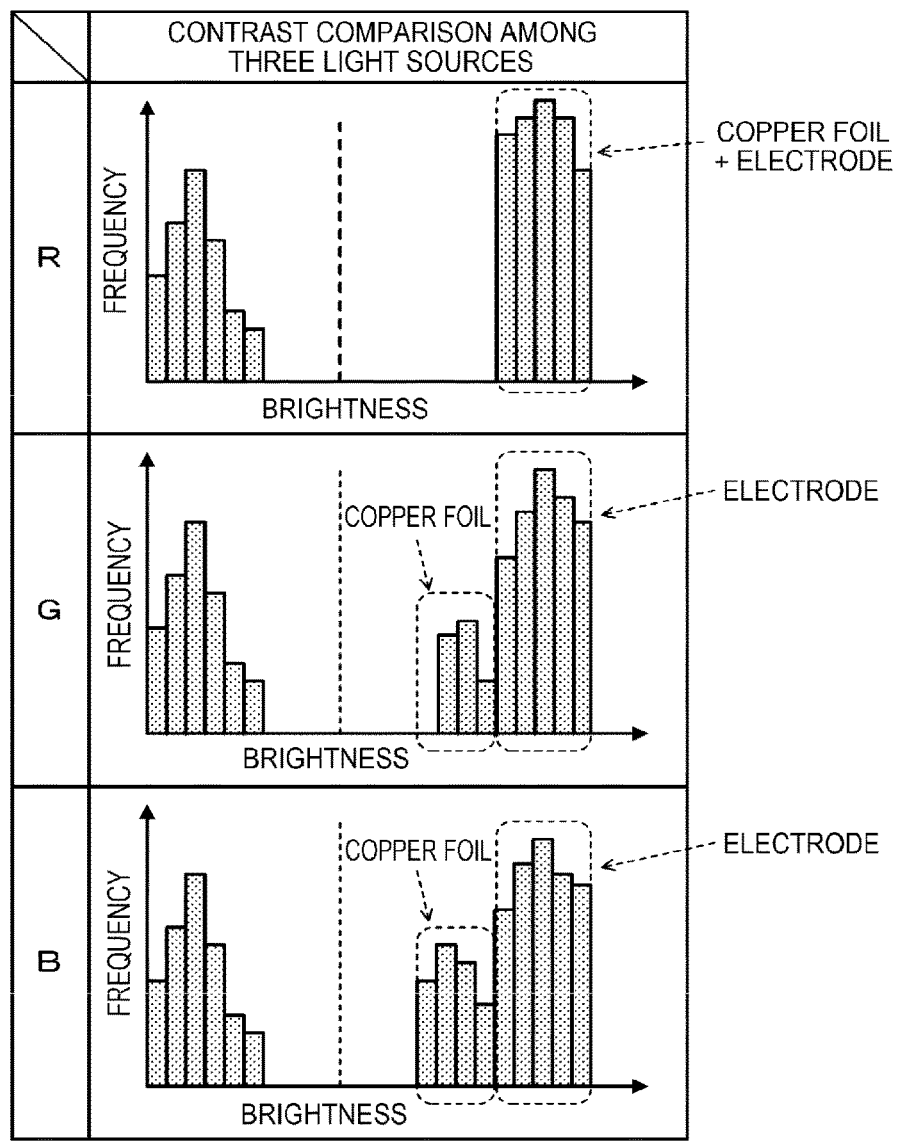
FIG. 12 is an explanatory diagram for execution of contrast comparisons of the individual colors.

Here, a circuit wiring made of a copper foil is formed on a front surface of board 80, and a component is mounted in such a manner that the electrode section is brought into contact with solder S applied onto the circuit wiring on board 80. As a result, as shown in an enlarged portion in FIG. 10, in the event that there occurs an irregularity in application of solder S to the circuit wiring (the copper foil) printed on board 80, causing the copper foil to be exposed, there may be a case in which the copper foil is shown as a part of the background of electrode section 82b in the captured image. The copper foil generally has a red-brown gloss and exhibits a high reflectance for an illumination light of R, while exhibiting a low reflectance for illumination lights of G and B. On the other hand, the electrode section is silver in color and exhibits a high reflectance for any of the illumination lights of R, G, B. As a result, in the case that the copper foil is shown in the background of the electrode section in the captured image, as shown in FIG. 12, in a captured image which is captured by illuminating with the monochromatic light of R, since the brightness value in the inspection area concentrates at high values, contrast C decreases, thereby making it difficult for the electrode section to be distinguished from the copper foil. That is, the recognition precision of the component is deteriorated. In contrast to this, in captured images which are captured by illuminating with the monochromatic lights of G and B, since the brightness value of the copper foil in the inspection area decreases, contrast C increases, thereby making it possible for the electrode section to clearly be distinguished from the copper foil. As a result, the recognition precision of the component can be enhanced.

In the embodiment described above, mark camera 50, functioning as the imaging device, is described as including lighting device 51 having the three light sources (LEDs 53a to 53c, 55a to 55c) of R, G, B and camera main body 58 including the monochromatic imaging element. However, the imaging device may be configured as a color camera including a lighting device having a light source of white light and a camera main body including a color imaging element. In this case, the imaging device can obtain three monochromatic images by dividing a color image generated by the camera main body into channels of R, G, B.

In the embodiment described above, CPU 61 is described as selecting any one monochromatic image in three monochromatic images of R, G, B which are obtained by imaging board 80 to thereby set the selected monochromatic image as an inspection image, executing an image processing for recognizing a component (an electrode section) in the inspection image, and executing a mounting inspection of the component. However, CPU 61 may adopt a configuration in which CPU 61 selects any one monochromatic image in three monochromatic images of R, G, B which are obtained by imaging a fiducial mark or a block skip mark which is affixed to a board to thereby set the monochromatic image so selected as an inspection image and then executes an image processing for recognizing the fiducial mark or the block skip mark in the inspection image so set. The fiducial mark is, for example, a mark provided at two diagonal corners of a board and is used to correct the orientation (position and inclination) of the board or the like. The block skip mark is a mark for indicating whether a board block is a good block or a bad block in the case that a board is formed so that multiple child boards (board blocks) can be taken from the board. Component mounter 10 mounts a component only on a good block and does not mount a component on a bad block.

In the embodiment described above, component mounter 10 is described as doubling as the inspection device; however, an inspection device for exclusive use for inspection may be provided downstream of component mounter 10 in the board conveyance direction in the production line.

As has been described heretofore, according to a first gist of the present disclosure, there is provided a first inspection device constituting an inspection device for executing a mounting inspection of a component using an inspection image of a board on which the component is mounted, including an imaging device configured to obtain three monochromatic images of the board in R, B, G, and an image processing device configured to set a board color using brightness values of the three monochromatic images so obtained, calculate complementary colors of the board color so set, determine on a color component having a largest brightness value in individual color components of the complementary colors so calculated, and set the monochromatic image having the color component so determined in the obtained three monochromatic images as the inspection image.

The first inspection device of the present disclosure obtains the three monochromatic images of the board in R, G, B and sets the board color using the respective brightness values of the three monochromatic images so obtained. Subsequently, the first inspection device calculates the complementary colors of the set board color and determines on the color component having the largest brightness value in the color components of the complementary colors so calculated. Then, the first inspection device sets the monochromatic image having the determined color component in the three monochromatic images as the inspection image. As a result, since the image captured using the optimum light source while recognizing the board color can be used for the mounting inspection of the component, the inspection precision can be improved further.

The first inspection device of the present disclosure that has been described above may adopt a configuration in which the image processing device prepares histograms of brightness values for the three monochromatic images and sets a combination of most frequently occurring brightness values in the histograms so prepared as the board color. As a result, since a ratio of an area occupied by the board in the image is large normally, by obtaining the combination of most frequently occurring brightness values in the respective histograms of the three monochromatic images, the board color can easily be specified.

According to a second gist of the present disclosure, there is provided a second inspection device constituting an inspection device for executing a mounting inspection of a component using an inspection image of a board on which the component is mounted, including:

an imaging device configured to obtain three monochromatic images of the board in R, B, G; and an image processing device configured to calculate a contrast within a predetermined area including at least an electrode section that the component has and an electrode circumferential portion whose reflectance differs from a reflectance of the electrode section individually for the obtained three monochromatic images and set the monochromatic image of a color component having a largest value in the contrast in the three monochromatic images as the inspection image.

The second inspection device of the present disclosure obtains the three monochromatic images of the board in R, G, B and calculates a contrast within the area including at least the electrode section that the component has and the electrode circumferential portion whose reflectance differs from the reflectance of the electrode section individually for the obtained three monochromatic images. Then, the second inspection device sets the monochromatic image of the color component having the largest value in the contrast in the three monochromatic images as the inspection image. As a result, since the image captured using the optimum light source for distinguishing between the electrode section and the electrode circumferential portion can be used for the mounting inspection of the component as the inspection image, the inspection precision can be improved further.

The second inspection device of the present disclosure that has been described above may adopt a configuration in which the image processing device inputs thereinto dimensions of the component, sets an area which is larger by one size than an external shape of the component based on the dimensions of the component so inputted as the predetermined area, and calculates a contrast in the area so set. As a result, the area including the electrodes of the component is easily set by inputting the dimensions of the component, whereby a monochromatic image suitable for recognizing the electrodes can be obtained.

Alternatively, the second inspection device of the present disclosure may adopt a configuration in which the image processing device sets multiple areas each including a different electrode section of multiple electrode sections possessed by the component and a circumferential portion of the different electrode section as the predetermined area and sets the inspection image for each of the multiple areas. As a result, the monochromatic image suitable for recognizing the electrode can be obtained for each of the multiple electrodes possessed by the component.

The second inspection device of the present disclosure may adopt a configuration in which a circuit wiring is formed of a copper foil on the board, the component is mounted on the board in such a manner that the electrode sections are brought into contact with the solder applied to the circuit wiring, and the image processing device calculates a contrast in a predetermined area including the electrode section of the component and the solder and/or the circuit wiring as the electrode circumferential portion for each of the three monochromatic images. As a result, the monochromatic image suitable for distinguishing the electrode sections of the component from solder S or the circuit wiring (the copper foil) can be obtained.

In addition, the first or second inspection device of the present disclosure may adopt a configuration in which the inspection device includes a lighting device which can independently irradiate three monochromatic lights of R, G, B on the board, and the imaging device is a monochromatic camera for obtaining the three monochromatic images by imaging the board which is independently and individually irradiated with the three monochromatic lights independently irradiated from the lighting device.

INDUSTRIAL APPLICABILITY

The present disclosure can be applied to a manufacturing industry of inspection devices or component mounters.

REFERENCE SIGNS LIST

10 component mounter, 11 housing, 22 board conveyance device, 23 part camera, 24 nozzle station, 30 head moving device, 31 X-axis guide rail, 32 X-axis slider, 33 X-axis actuator, 35 Y-axis guide rail, 36 Y-axis slider, 37 Y-axis actuator, 40 head, 41 Z-axis actuator, 42 θ-axis actuator, 45 suction nozzle, 50 mark camera, 51 lighting device, 52 housing, 53 epi-illuminating light source, 53a red LED, 53b green LED, 53c blue LED, 53d support plate, 54 half mirror, 55 side light source, 55a red LED, 55b green LED, 55c blue LED, 55d support plate, 56 diffuser plate, 58 camera main body, 60 control device, 61 CPU, 62 ROM, 63 HDD, 64 RAM, 65 input and output interface, 66 bus, 70 feeder, 71 reel, 72 tape, 73 accommodation recessed section, 74a component supply position, 80 board, 81, 82 component, 81a, 82a body, 81b, 82b electrode, S solder

The invention claimed is:

1. An inspection device for executing a mounting inspection of a component using an inspection image of a board on which the component is mounted, comprising:

an imaging device configured to obtain three monochromatic images of the board in red, green, and blue; and an image processing device configured to analyze each of the monochromatic images and count occurrences of brightness values 0 to 255;

determine a board color R, G, B based on a highest count of the occurrences of the brightness values of the three monochromatic images, determine a complementary color R', G', B' of the board based on a highest brightness value among the board color R, G, B, and a lowest brightness value among the board color R, G, B, and, determine a color component as having a largest brightness value in the complementary color R', G', B', and select a monochromatic image of the three monochromatic images corresponding to the color component as the inspection image.

2. The inspection device according to claim 1, wherein the image processing device individually prepares histograms of the occurrences of the brightness values for the three monochromatic images and determines the board color based on a combination of most frequently occurring brightness values in the histograms.

3. The inspection device according to claim 1, comprising:
a lighting device capable of independently irradiating three monochromatic lights of red, green, and blue onto the board,
wherein the imaging device constitutes a monochromatic camera configured to obtain the three monochromatic images by imaging the board by irradiating the board with the three monochromatic lights which are independently irradiated from the lighting device.

* * * * *